US 8,434,670 B2
(12) United States Patent
Okada et al.

(10) Patent No.: US 8,434,670 B2
(45) Date of Patent: May 7, 2013

(54) REPAIR APPARATUS AND REPAIR METHOD

(75) Inventors: Toru Okada, Kawasaki (JP); Satoshi Emoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/485,642

(22) Filed: Jun. 16, 2009

(65) Prior Publication Data
US 2009/0321500 A1    Dec. 31, 2009

(30) Foreign Application Priority Data
Jun. 26, 2008   (JP) .................. 2008-167394

(51) Int. Cl.
B23K 3/00 (2006.01)
B23K 3/04 (2006.01)
B23K 1/00 (2006.01)
B23K 1/018 (2006.01)

(52) U.S. Cl.
USPC ........................ 228/191; 228/264; 228/228

(58) Field of Classification Search .................. 228/264, 228/228, 191
See application file for complete search history.

(56) References Cited

U.S. PATENT DOCUMENTS

| | | | | |
|---|---|---|---|---|
| 3,263,057 A | * | 7/1966 | Conti | 219/56.21 |
| 4,444,559 A | * | 4/1984 | Schink et al. | 432/226 |
| 5,441,194 A | | 8/1995 | Nishimura et al. | |
| 5,549,240 A | * | 8/1996 | Urban | 228/264 |
| 5,560,531 A | * | 10/1996 | Ruszowski | 228/19 |
| 5,639,011 A | * | 6/1997 | Jacks et al. | 228/180.21 |
| 6,016,949 A | * | 1/2000 | Slesinger | 228/180.22 |
| 7,661,573 B2 | | 2/2010 | Saito et al. | |
| 2002/0117535 A1 | * | 8/2002 | Cox et al. | 228/19 |

FOREIGN PATENT DOCUMENTS

| | | |
|---|---|---|
| JP | 58-95677 | 6/1983 |
| JP | 58-95677 U | 6/1983 |
| JP | 6-244548 A | 9/1994 |
| JP | 08-046351 A | 2/1996 |
| JP | 11-503670 | 3/1999 |
| JP | 2000012630 A * | 1/2000 |
| JP | 2000-317629 A | 11/2000 |
| JP | 2001-96358 A | 4/2001 |
| JP | 2004-172560 | 6/2004 |
| JP | 2004-342639 A | 12/2004 |
| JP | 2006-108589 | 4/2006 |
| JP | 2006-344699 A | 12/2006 |

OTHER PUBLICATIONS

Computer translation of JP 2000012630 A.*

(Continued)

Primary Examiner — Erin Saad
(74) Attorney, Agent, or Firm — Fujitsu Patent Center

(57) ABSTRACT

A repair apparatus includes a heating head device configured to heat a soldering member, which is soldered to a circuit board. The heating head device includes a heating head and a contact member heated by the heating head. The contact member is formed of a material having a spring characteristic and a thermal conductivity higher than a thermal conductivity of the heating head. The contact member is configured to be brought into contact with a soldered surface of the soldering member with an elastic force so as to melt a solder joining the soldering member to the circuit board.

11 Claims, 7 Drawing Sheets

OTHER PUBLICATIONS

Taiwanese Office Action mailed Jan. 18, 2012 for corresponding Taiwanese Application No. 098120074, with partial English-language translation.

Japanese Office Action mailed May 8, 2012 for corresponding Japanese Application No. 2008-167394, with English-language Translation.

"Japanese Office Action" mailed by JPO and corresponding to Japanese application No. 2008-167394 on Jul. 31, 2012, with English translation.

Japanese Office Action mailed Oct. 30, 2012 for corresponding Japanese Application No. 2008-167394, with English-language translation.

* cited by examiner

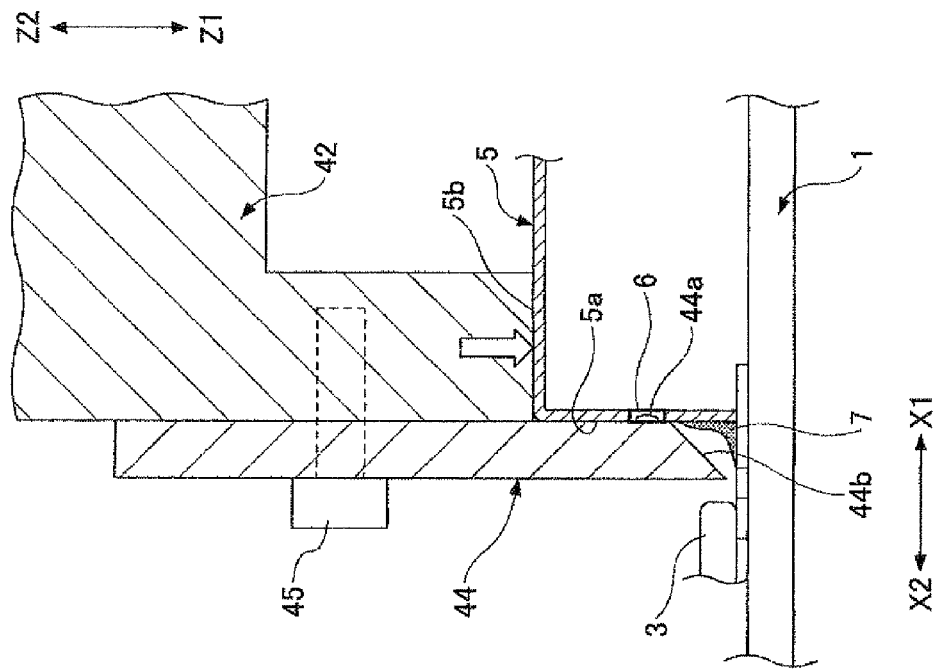

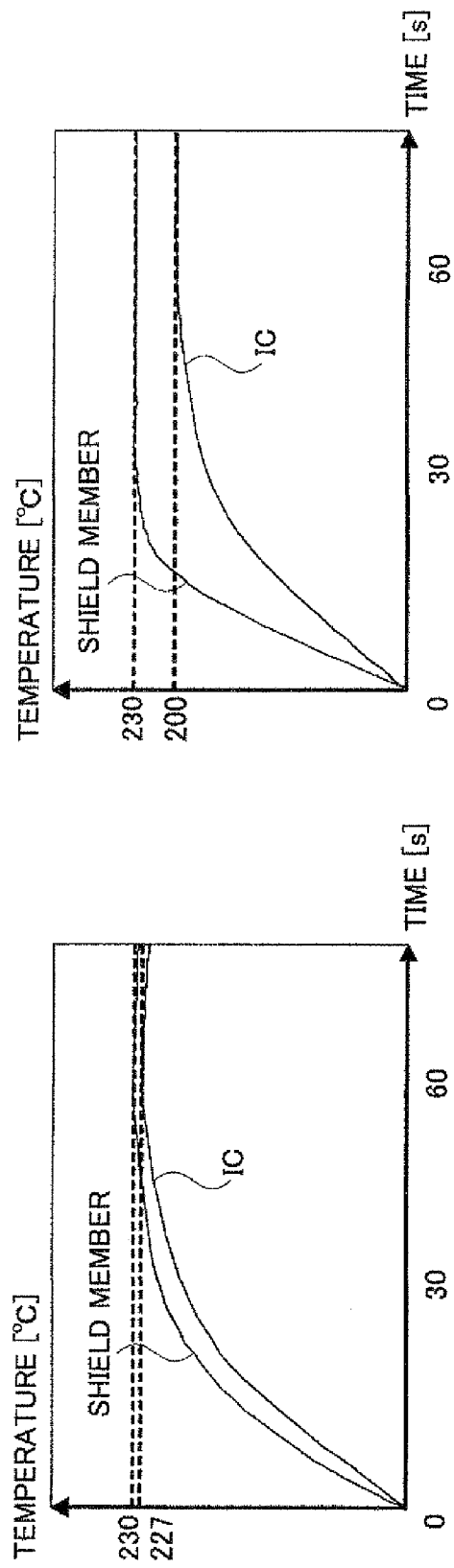

REPAIR APPARATUS AND REPAIR METHOD

CROSS-REFERENCE TO RELATED APPLICATIONS

This application is based upon and claims the benefit of priority of the prior Japanese Patent Application No. 2008-167394, filed on Jun. 26, 2008, the entire contents of which are incorporated herein by reference.

FIELD

The embodiment discussed herein is directed to a repair technique to repair a circuit board having parts mounted thereon by soldering.

BACKGROUND

For example, in electronic equipments such as a cellular phone, a group of circuit units for processing radio frequency signals having different frequencies, such as a microprocessor and a SWA filter, are mounted on the same circuit board. In such a case, there may be a problem in that an interference of radio frequencies occurs between the circuit units.

In order to solve such as problem, a shield member 5 (metal case) made of a metal is mounted on a circuit board 1 of a cellular phone to shield a group of electronic parts 2, as illustrated in FIG. 1. The shield member 5 is mounted on the circuit board 1, on which a solder paste is printed, simultaneously with mounting of the electronic parts 2 and electronic parts 3, and joined to the circuit board 1 by solder-reflow collectively. The problem of radio frequency interference may be solved by such a structure of having the shield member 5 made of a metal. However, on the other hand, there may occur another problem if a defect occurs in the electronic parts arranged inside the shield member 5.

When a defect occurs in one of the electronic parts 2, the defective electronic part 2 is removed from the circuit board 1, and a repair process is applied to replace the defective electronic part 2 with a good electronic part 2 (refer to Patent Document 1). Normally, the shield member 5 is mounted on the circuit board 1 to surround the electronic parts 2 arranged inside the shield member 5 with a small distance, such as about 1 mm, from the electronic parts 2.

Accordingly, if a replacement is needed for the electronic parts 2, there are many cases in which the shield member 5 prevents the replacement work from being carried out. Thus, in many cases, the electronic parts 2 must be replaced with other electronic parts 2 after removing the shield member from the circuit board 1. Because the shield member 5 is joined to the circuit board 1 in its entire circumference by soldering, the only one method to remove the shield member 5 is to melt the solder, which joins the shield member 5 to the circuit board 1.

In order to remove the shield member 5 from the circuit board 1, it is necessary to heat the entire solder-joined part of the shield member 5 simultaneously. Accordingly, using a method of heating a large area, such as using a hot air, was suggested. However, such a method was not actually used because it was difficult to acquire reliability of products after shipment due to a problem in that the electronic parts 2 arranged inside the shield member 5 and the electronic parts 3 arranged outside the shield member 5 are heated simultaneously to a temperature close to a melting point (217° C.) of the solder.

Thus, other methods to heat the shield member 5 alone were suggested, such as a method illustrated in FIG. 2A and a method illustrated in FIG. 2B. In the method illustrated in FIG. 2A, a heating head 100 is brought into contact with a top surface 5b of the shield member 5 to heat the solder 7 by a heat transmitted from an upper portion of the shield member 5. In the method illustrated in FIG. 2B, the heating head 100 is brought into contact with a side surface 5b of the shield member 5 to heat the solder 7 by a heat transmitted from a portion closer to the solder 7 than that of the method illustrated in FIG. 2A.

Patent Document 1: Japanese Laid-Open Patent Application No. 08-046351

However, because it is difficult to stably heat the solder 7 according to the above-mentioned methods illustrated in FIGS. 2A and 2B, those methods have not been used practically.

That is, according to the method illustrated in FIG. 2A, it is difficult to melt the solder 7 unless the temperature of the heating head 100 is raised to a temperature around 400° C. because the shield member 5 is normally made of a stainless steel plate with nickel or tin plating, which provides a poor heat conduction, and the heating position is distant from the solder 7. Additionally, if the heating head 100 having such a high-temperature is brought into contact with the shield member 5, color degradation progresses due to oxidation of the shield member 5, thereby raising a problem in that dusts are generated and an insulating layer is formed on a surface of the shield member 5, which degrades a shielding property of the shield member 5.

According to the method illustrated in FIG. 2B, in association with high-density mounting of the circuit board 1, there are many cases in which the electronic parts 3 are arranged at a small distance, such as 0.2 mm, from the position where the shield member 5 is arranged. Thus, it is very difficult to bring the heating head 100 into contact with the side surface 5a of the shield member 5.

If the solder 7 is melted by a contact-heating tool having a flat tip being brought into contact with the solder 7 instead of the heating head 100, a flux may adhere a surface of the contact-heating tool, which flux thermally insulates the contact-heating tool. Thus, it is difficult to melt the solder 7 surely. Additionally, it is necessary to clean the contact-heating tool after each operation in order to stably melt the solder 7, which raises a problem in that it is inconvenient for an operator to perform a cleaning operation.

SUMMARY

According to an aspect of the invention, a repair apparatus includes: a heating head device configured to heat a soldering member, which is soldered to a circuit board, wherein the heating head device includes: a heating head; and a contact member heated by the heating head, the contact member being formed of a material having a spring characteristic and a thermal conductivity higher than a thermal conductivity of the heating head, the contact member being configured to be brought into contact with a soldered surface of the soldering member with an elastic force so as to melt a solder joining the soldering member to the circuit board.

According to another aspect of the invention, a repair method includes: melting a solder, which joins a soldering member to a circuit board, by heating the solder by contacting a contact member with a soldered surface of the soldering member; supplying an inert gas to the soldering member; and removing the soldering member from the circuit board after the solder is melted.

The object and advantages of the embodiment will be realized and attained by means of the elements and combinations particularly pointed out in the appended claims.

It is to be understood that both the foregoing general description and the following detailed description are exemplary explanatory only and are not restrictive of the invention, as claimed.

BRIEF DESCRIPTION OF DRAWINGS

FIG. 6A is a cross-sectional view of a heating head and a shield member separated from the heating head;

FIG. 6B is a cross-sectional view of the heating head and the shield member attached to the heating head;

FIG. 7A is a graph indicating temperature changes of an electronic part and a shield member in a conventional heating process; and FIG. 7B is a graph indicating temperature changes of an electronic part and the shield member in a heating process performed by the rework apparatus according to the embodiment.

DESCRIPTION OF EMBODIMENT(S)

Preferred embodiment of the present invention will be explained with reference to the accompanying drawings.

Figure 1:
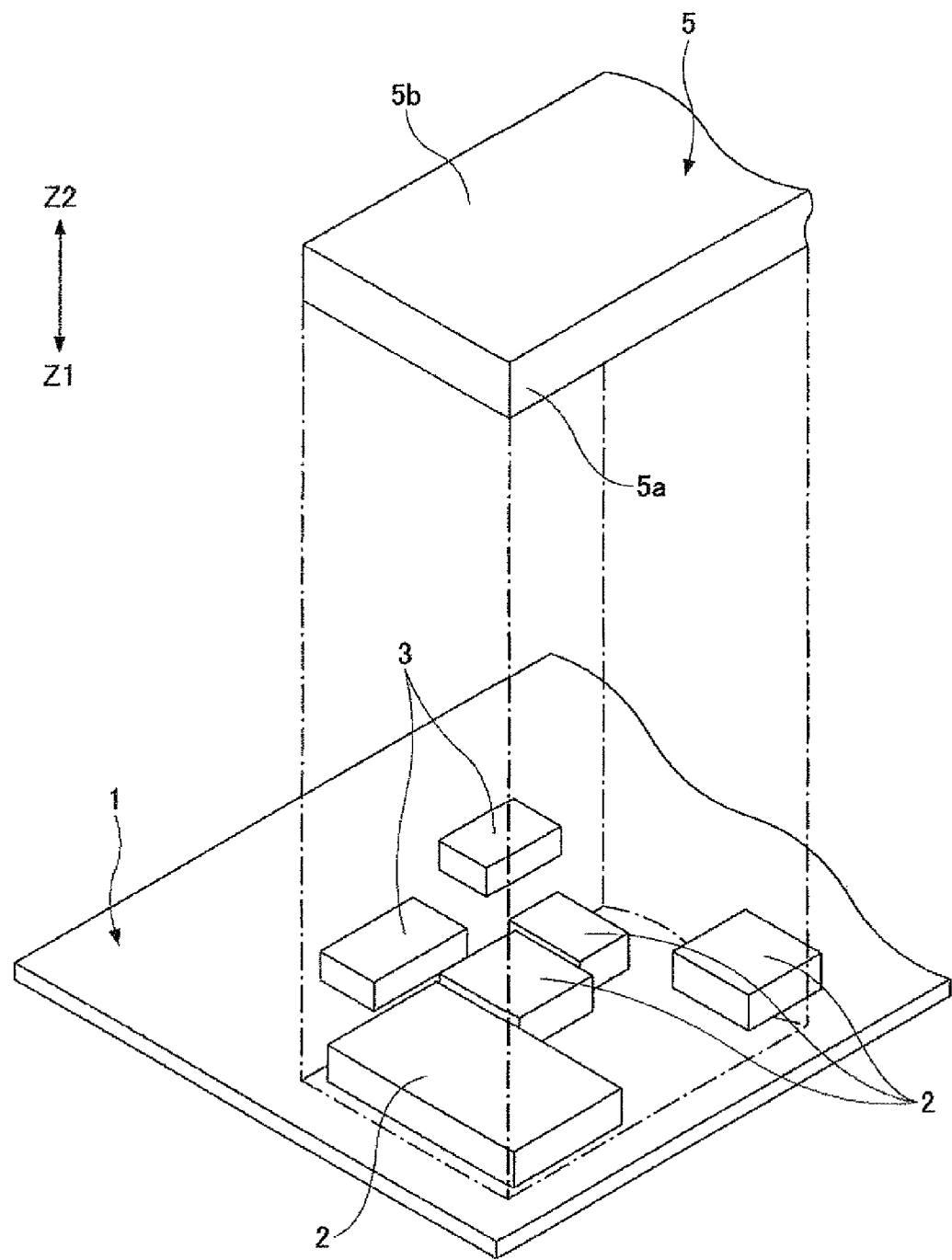
FIG. 1 is a perspective view of a shield member and a circuit board.
Figure 2A:
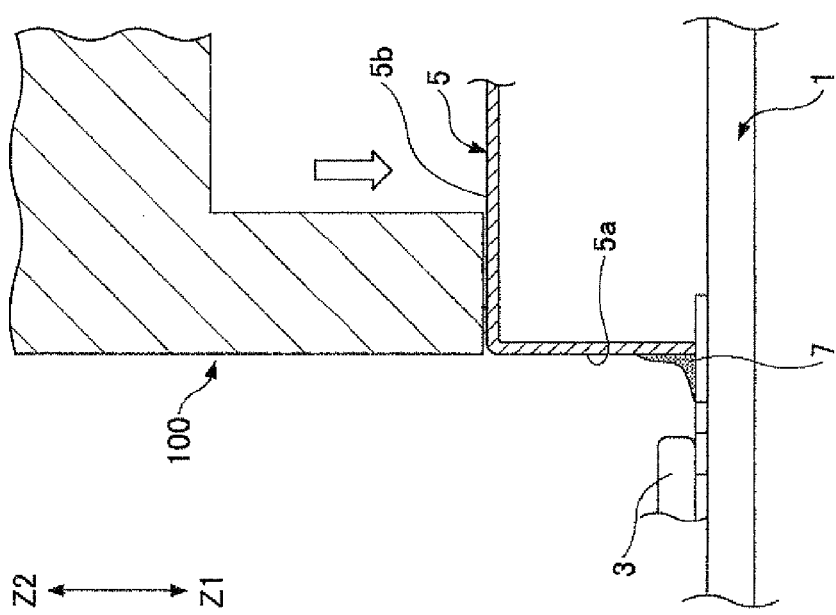
FIG. 2A is a cross-sectional view of a heating head in contact with a top surface of the shield member.
Figure 2B:
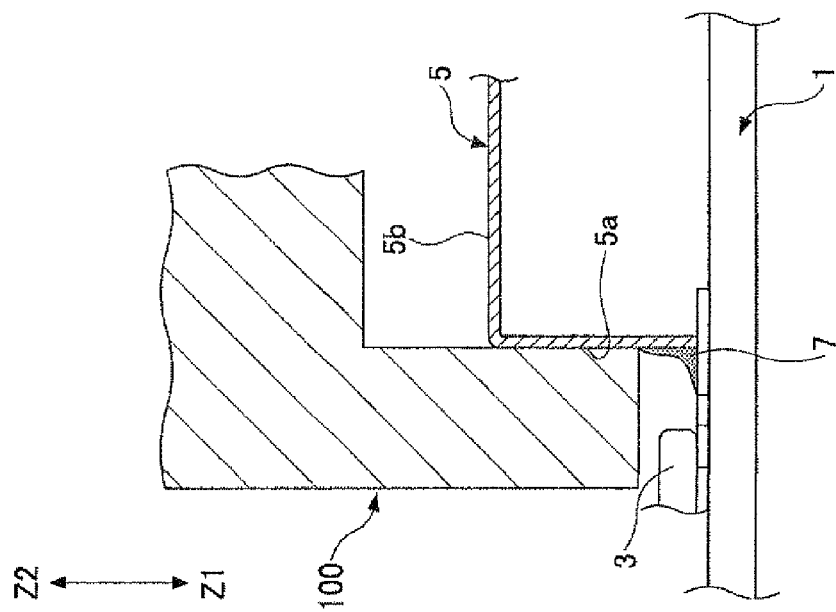
FIG. 2B is a cross-sectional view of the heating head in contact with a side surface of the shield member.
Figure 3B:
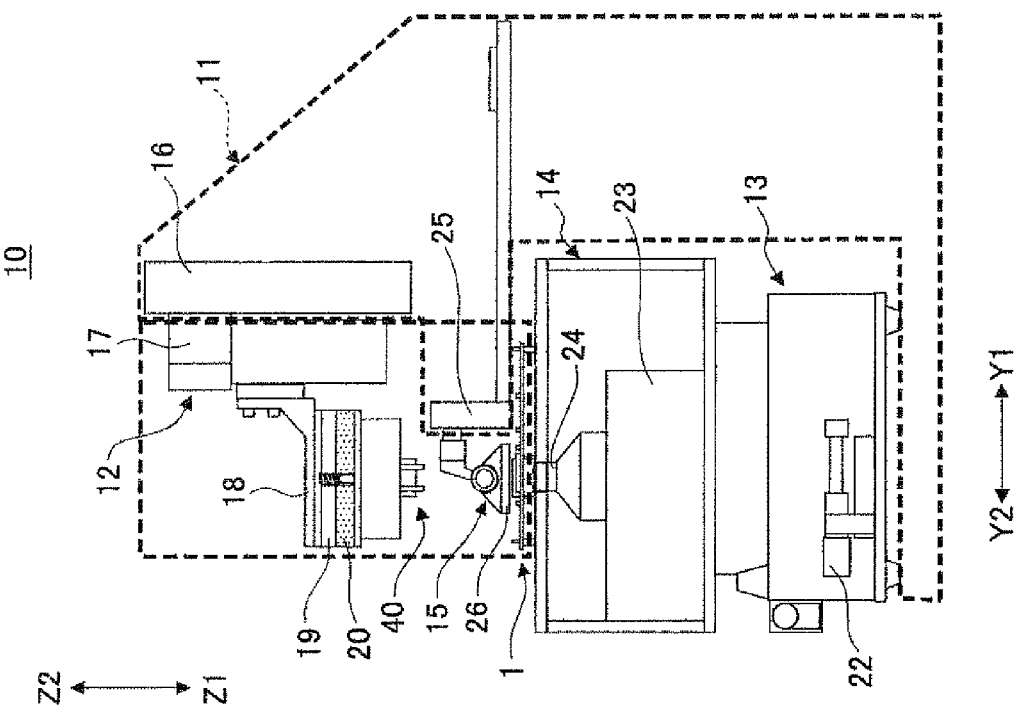
FIG. 3B is a side view of the rework apparatus shown in FIG. 4A.
Figure 3A:
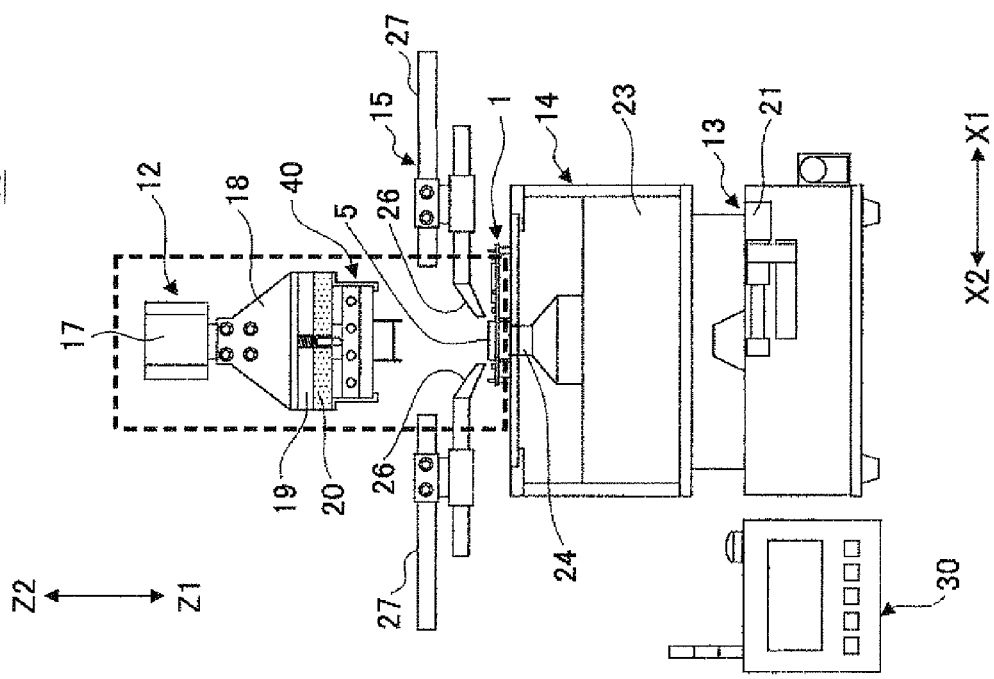
FIG. 3A is a front view of a rework apparatus as a repair apparatus according to an embodiment.
Figure 4:
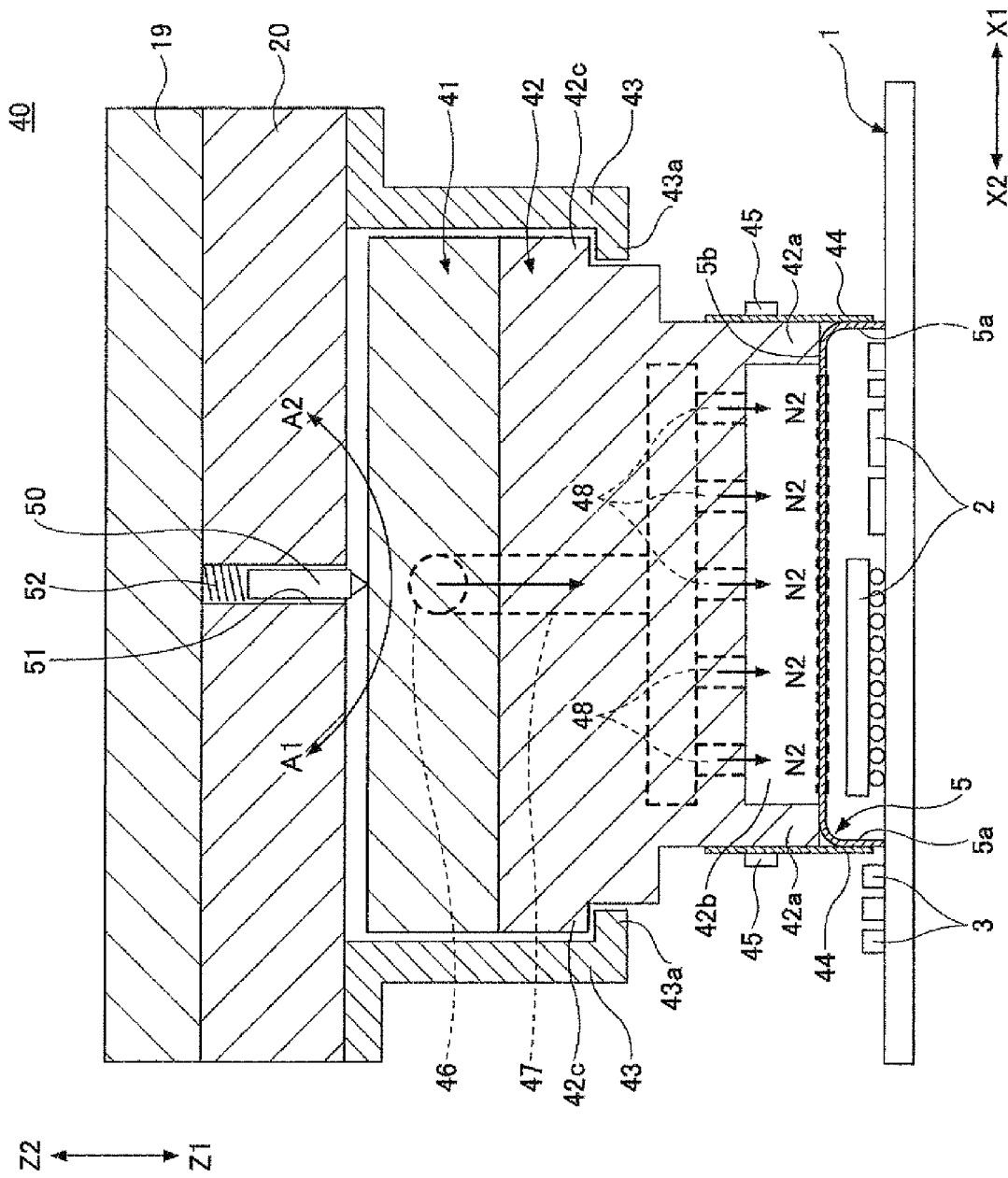
FIG. 4 is a cross-sectional view of a heating head device.

FIGS. 3A and 3B illustrate a rework apparatus 10 as a repair apparatus according to an embodiment. FIG. 4 illustrates a heating head device 40 provided in the rework apparatus 10. The rework apparatus 10 is used in a repair process of a circuit board 1 when a defect occurs in electronic parts 2, which are mounted on the circuit board 1 and arranged inside a shield member 5. The shield member 5 is mounted on the circuit board 1 by soldering. The shield member 5 corresponds to an example of a soldering member, which is mounted onto the circuit board 1 by soldering.

The repair process means a process for removing a defective electronic part 2 from the circuit board 1 and, instead, mounting a good electronic part 20 onto the circuit board 1. In the present embodiment, the shield member 5 is made of a stainless steel plate having a thermal conductivity of 15 W/m·K Generally, the rework apparatus 10 includes a housing 11, a lifting device 12, a positioning device 13, a stage device 14, and a cooling $N_2$ supply device 15. The housing 11 supports the lifting device 12, the positioning device 13, the stage device 14, and the cooling $N_2$ supply device 15.

The lifting device 12 includes a lifting base 16, a drive device 17, an arm 18, an attaching part 19, a thermal insulation part 20, and the heating head device 40. The lifting base 16 is fixed to the housing 11, and the drive device 17 is fixed to the lifting base 16. The drive device 17 is capable of moving the arm 18 relative to the circuit board 1 in vertical directions (directions indicated by arrows Z1 and Z2 in the figure). The drive device 17 is a linear actuator such as an air cylinder or a liner motor.

The arm 18 is provided with the attaching part 19 for attaching the heating head device 40. The thermal insulation part 20 is provided to the bottom of the attaching part 19 so that the heating head device 40 is attached to the attaching part 19 via the thermal insulation part 20.

Accordingly, when the heating head device 40 generates a heat, a transmission of the heat is blocked off by the thermal insulation part 20, and the heat is not transmitted to the arm 18 and the lifting device 12. For the sake of convenience of explanation, the detail of the heating head device 40 is mentioned later.

The positioning device 13 carries the stage device 14 on an upper portion thereof. The positioning device 13 is configured and arranged to move the stage device 14 in directions indicated by arrows X1 and X2 and arrows Y1 and Y2 in the figure. Thus, the positioning device 13 is provided with a drive device 21 for moving the stage device 14 in the X1 and X2 directions and a drive device 22 for moving the stage device 14 in the Y1 and Y2 directions.

The circuit board 1 is placed on a top surface of the stage device 14. A plurality of electronic parts 2 and 3 are mounted on the circuit board 1, and also the shield member 5 is mounted by soldering to the circuit board 1 so as to cover the electronic parts 20, which require shielding. An entire circumference of the shield member 5 is soldered to the circuit board 1. The shield member 5 is made of a conductive metal, and is formed in a box-like shape having side surfaces 5a and a top surface 5b with an open bottom. Engagement holes 6 are formed in the side surfaces 5a so as to be brought into engagement with a clamper 44 mentioned later.

The stage device 14 is provided with a hot-air generating device 23 therein. A hot-air injection nozzle 24 is provided in an upper portion of the hot-air injection nozzle 24. A hot-air generated in the hot-air generating device 23 is injected onto the shield member 5 from the hot-air injection nozzle 24. The hot air is an example of a heating gas, and the hot-air injection nozzle 24 is an example of a heating gas injection nozzle.

The cooling $N_2$ supply device 15, which is an example of a cooling gas supply device, is arranged above the stage device 14. The cooling $N_2$ supply device 15 has an $N_2$ injection nozzle 26 fixed to a shaft 27. The cooling $N_2$ supply device 15 including the $N_2$ injection nozzle 26 is connected to an $N_2$ gas supply source (not illustrated in the figure) so that an $N_2$ gas as a cooling gas is injected from the $N_2$ injection nozzle 26.

The $N_2$ injection nozzle 26 is configured and arranged to inject an $N_2$ gas as a cooling gas toward a repair position mentioned later where the shield member 5 is attached to and detached from the circuit board 1. The temperature of the $N_2$ gas injected from the $N_2$ injection nozzle 26 is set to a temperature equal to or lower than a normal temperature (for example, 20° C.±15° C.). An operation device 30 is operated by an operator to control an operation of the rework apparatus 10.

A description will now be given, with reference to FIG. 4, of a structure of the heating head device 40.

The heating head device 40 includes the attaching part 19, the thermal insulation part 20, a heater block 41, a heating head 42, and a clamper 44. The clamper 44 corresponds to an example of a contact member, which is configured to be brought into contact with the shield member 5 as a soldering member. The attaching part 19 is fixed to the above-mentioned arm 18. The thermal insulation part 20 is attached to the bottom of the attaching part 19. The attaching part 19 is provided to prevent a heat generated in the heater block 41 from being transferred to the lifting device 12 through the arm. A glass wool insulation, a rock wool insulation, a ceramic insulation or the like may be used as the thermal insulation part 20.

A head guide 43 is provided at a peripheral position of the bottom surface of the thermal insulation part 20 so as to extend in a downward direction (Z1 direction). The head guide 43 has a claw part 43*a* extending inward from a bottom end thereof.

The heater block 41 and the heating head 42 are arranged between the thermal insulation part 20 and the claw part 43*a* of the head guide 43. The heater block 41 and the heating head 42 are integrated with each other in a state where the heater block 41 is an upper portion and the heating head 42 is a lower portion.

A heater (not illustrated in the figure) serving as a heating means is incorporated into the heater block 41. The heating head 42 is formed of a thermally conductive metal (for example, brass). Thus, when the heater of the heater block 41 generates a heat, the heat is transferred to the heating head 42.

The heater block 41 and the heating head 42 are engaged with the head guide 43. Specifically, the heating head 42 is supported by the head guide 43 by a step part 42*c* being engaged with the claw part 43*a*. Thereby, the heater block 41 and the heating head 42 are movable slightly within the head guide 43.

An attaching hole 51 is formed at a center position of the thermal insulation part 20. A pivot 45 is provided in the attaching hole 51. The pivot 45 is elastically pressed by a coil spring 52 in a downward direction (Z1 direction). Accordingly, the heater block 41 and the heating head 42 integrated with each other are movable (swingable) about the pivot 45 as a center in directions indicated by arrows A1 and A2 in FIG. 4. A range of the swing motion of the integrated heater block 41 and heating head 42 is set so that the clamper 44 is easily and surely attached to the shield member 5 mounted on the circuit board 1.

A space part 42*b* is formed on the bottom surface of the heating head 42. The space part 42*b* is configured and arranged to face the top surface 5*b* of the shield member in a state where the heating head 40 is attached to the shield member 5 (the state illustrated in FIG. 4).

A plurality of N$_2$ injection holes 48 are formed in the surface facing the top surface 5*b* of the space part 42*b*. The N$_2$ injection holes 48 are connected to the N$_2$ supply device (not illustrated in the figure) through an N$_2$ supply passage 47 and an N$_2$ supply port 46.

When a heating process is performed on the shield member 5 by the heating head device 40, an N$_2$ gas is injected from the N$_2$ injection holes 48 toward the top surface 5*b* of the shield member 5. Thereby, the top surface 5*b* of the shield member 5 is prevented from being discolored due to oxidation even if the shield member 5 is heated by the heating head device 40.

The heating head has an extending part 42*a* surrounding the space part 42*b* formed on the bottom surface of the heating head 42. The extending part 42*a* extends in a downward direction (Z1 direction). The clamper 44 is fixed to an outer surface of the extending part 42 by fixing screws 45.

The clamper 44 is formed of a metal material having a spring characteristic, such as, for example, an oxygen-free copper, which has a thermal conductivity (for example, 403 W/m·K) higher than a thermal conductivity (for example, 106 W/m·K) of the heating head 42. Surfaces of the clamper 44, which is formed of an oxygen-free copper, are chrome-plated so as to prevent an oxidation. The thickness of the clamper 44 is, for example, 0.3 mm to 0.4 mm.

The clamper 44 of the above-mentioned structure is heated by the heater block 41 through the heating head 42. Because the thermal conductivity of the clamper 44 is higher than that of the heating head 42, a heat (a heat transferred from the heater block 41) is efficiently transferred to the clamper 44. Thus, the temperature of the clamper 44 is raised to a temperature equal to or higher than a temperature (about 217° C.) at which the solder 7 is melted.

The clamper 44 is a plate-like member, which is capable of contacting the side surface 5*a*, which is used as a soldering surface, of the shield member 51 with an elastic force. In the present embodiment, the clamper 44 is provided to each of opposite sides of the heating head 42, and a distance between the clampers 44 matches an outer shape of the shield member 5. Accordingly, the shield member 5 is sandwiched by the pair of clampers 44 provided to the heating head 42.

Further, as mentioned above, engagement holes 6 are formed in the side surfaces 5*a* (refer to FIGS. 6A and 6B). Each of the clampers 44 has a protrusion 44*a* on an inner side thereof (the side facing the shield member 5). The protrusion 44 is configured to be engaged with the corresponding engagement hole 6.

When attaching the heating head device 40 to the shield member 5, the clamper 44 moves downward (in the direction Z1) while the protrusion 44*a* slides on the side surface 5*a* as illustrated in FIG. 6A. Then, the protrusion 44*a* is brought into engagement with the engagement hole 6 as illustrated in FIG. 6B when the protrusion has moved to a position corresponding to the engagement hole 6.

Therefore, when holding the shield member 5 by the clampers 44, the shield member 5 is retained by the engagement of the protrusions 44*a* with the respective engagement holes 6 in addition to a retaining action by the elastic force of the clampers 44. Thus, the shield member 5 can be surely retained by the heating head device 40. It should be noted that if protrusions are formed on the side surfaces 5*a* of the shield member 5 and concave parts, which are configured to be engaged with the protrusions, are formed in the clampers 44, the shield member 5 can also be surely retained by the heating head device 40.

The clamper 44 is provided with a slanting surface 44*b* at a lower end thereof (an end in the Z1 direction). The slanting surface 44*b* is provided on an inner side of the clamper 44 (a side facing the shield member 5). By forming the slanting surface 44 on the clamper 44, the clamper 44 can be positioned close to the solder 7, which joins the shield member 5 to the circuit board 1.

Figure 5:
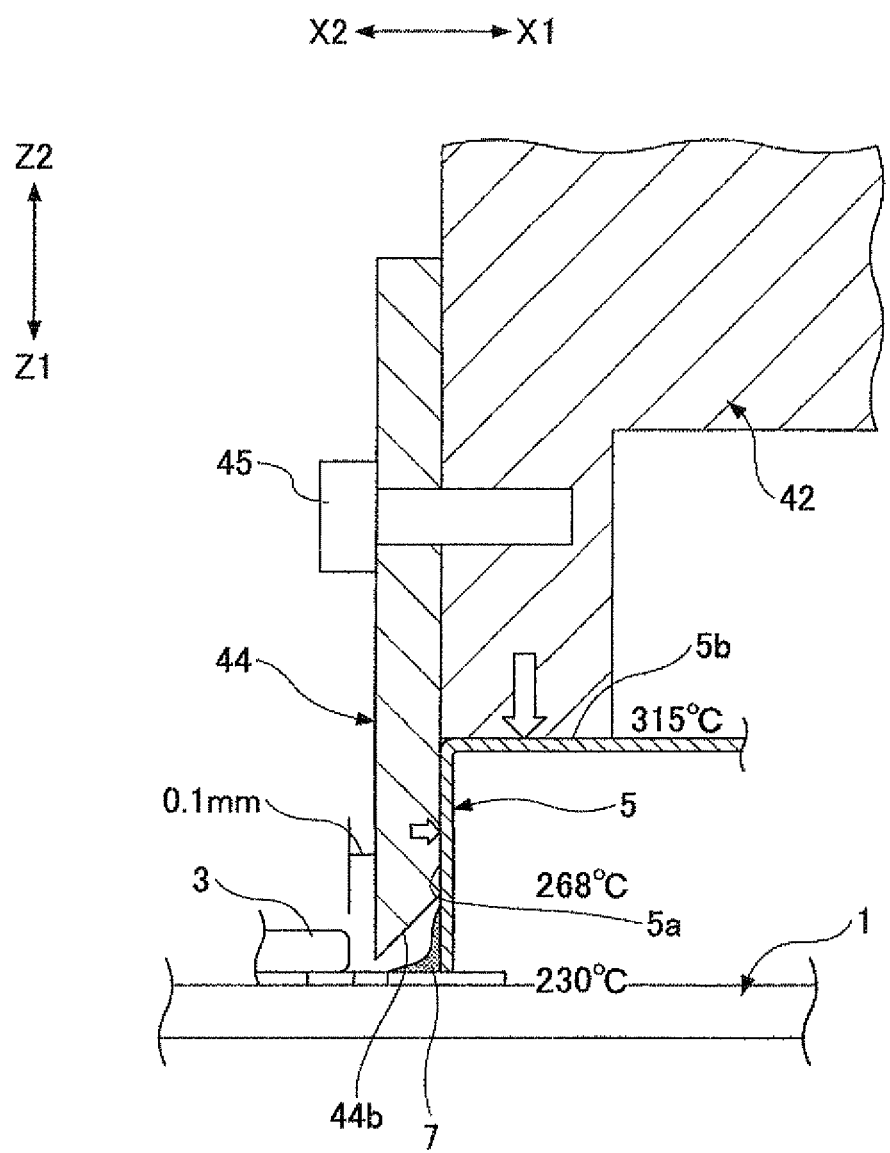
FIG. 5 is an enlarged view of a portion of a heating head device in a vicinity of a clamper.

When the shield member 5 is soldered to the circuit board 1, the solder 7 is changed into a form of a solder fillet. If the clamper 44 is brought into contact with the solder 7, the solder 7 and a paste may adhere to the surface of the clamper 44, which may soil the clamper 44. Thus, the clamper 44 must be separate from the solder 7 in a state where the shield member 5 is retained by the clampers 44. The solder fillet of the solder 7 extends along the side surface 5*a* of the shield member 5 as illustrated in FIG. 5. Thus, the side surface 5*a* corresponds to a soldered surface, which is joined to the circuit board 1 by the solder 7.

If the bottom end of the clamper 44 is flat, the clamper 44 can be moved to a position slightly above the solder 7 where the flat bottom surface of the clamper 44 is separated from the upper tip of the solder 7. On the other hand, if the slanting surface 44*b* is provided to the bottom of the clamper 44, the slanting surface 44*b* can be positioned closer to solder 7 as illustrated in FIGS. 5 and 6B. That is, the slanting surface 44*b* serves as a clearance part, which provides a clearance between the clamper 44 and the solder 7. Thus, the clamper 44

(slanting surface 44b) can be moved to a position closer to the solder 44, which achieves efficient heating of the solder 7.

A description will now be given of a repair method for repairing the circuit board 1 by replacing the electronic parts 2 mounted on the circuit board 1 using the rework apparatus 10. The electronic parts 2 are enclosed by the shield member 5 soldered to the circuit board 1.

In order repair the circuit board 1 (or the electronic parts 2), the circuit board 1 having the electronic part 2 to be replaced is attached to the rework apparatus 10. FIGS. 3A, 3B and 4 illustrate a state where the circuit board 1 is attached to the rework apparatus 10. The heating head device 40 is attached to the attaching part 19 of the rework apparatus 10. The heating head device 40 has the heating head 42, which can appropriately and efficiently heat the shield member 5 previously soldered to the circuit board 1.

After the circuit board 1 is attached to the rework apparatus 10, the hot-air generating device 23 is operated by the operation device 30. Thus, a hot air is blown onto the bottom surface of the circuit board 1 to preheat the circuit board 1.

At the same time, the heater incorporated in the heater block 42 of the heating head device 40 is also actuated to heat the heater block 41. As the heater block 41 is heated, the temperature of the heating head 42 is raised. The heating temperature of the heater block 41 is controlled so that the extending part 42a of the heating head 42 is heated to a temperature of, for example, 315° C.

Then, the operation device 30 drives the positioning device 13 to position the circuit board 1 so that the shield member 5 on the circuit board 1 is located at a position facing the heating head apparatus 40. After the positioning of the circuit board 1 to the heating head apparatus 40 is completed, the operation device 30 drives the drive device 17 of the lifting device 12 to move the heating head device 40 downward (move in the Z1 direction). Additionally, the operation device 30 actuates the $N_2$ supply device (not illustrated in the figure) to inject an $N_2$ gas from the $N_2$ injection holes 48 through the N2 supply port 46 and the $N_2$ supply passage 47.

With the downward movement of the heating head apparatus 40, the clampers 44 are brought into contact with the respective side surfaces 5a of the shield member 5. The heater block 41 and the heating head 42 integrated with each other are movable (swingable) about the pivot 45 as a center in the directions indicated by the arrows A1 and A2 in FIG. 4. Thus, if there is a positional offset between each clamper 44 and the shield member 5, such a positional offset is absorbed by the swing movement of the heater block 41 and the heating head 42, which causes the clampers 44 to be surely engaged with the shield member 5.

Each clamper 44 has a spring characteristic, and is in a cantilevered state by being fixed to the heating head 42 by the fixing screws 45. Additionally, the protrusion 44a is formed on the inner side of each clamper 44. Thus, each clamper 44 moves downward while being elastically deformed as illustrated in FIG. 6A after the clampers 44 are brought into contact with the shield member 5. The protrusions 44a slide on the respective side surfaces 5a of the shield member 5. At the time when the clampers 44 engage with the shield member 5, the heating of the shield member 5 by the clampers 44 is initiated.

When the heating head device 40 moves further downward, the protrusions 44a engage with the respective engagement holes 6. Thereby, the shield member 5 is sandwiched and retained by the clampers 44, which results in a state where the shield member 5 is retained by the heating head apparatus 40 (hereinafter, this state is referred to as attached state). In the attached state, the shield member 5 is retained by the heating head device 40 by the elastic force of the clampers 40 pressing the shield member 5 and the engaging force of the protrusions 44a with the engagement holes 6.

Moreover, in the attached state, the clampers 44 are firmly attached to side surfaces 5a of the shield member 5. Thus, the heat in the clampers 44 is transferred to the shield member 5 without loss. Further, because the slanting surface 44b is formed at the bottom end of each clamper 44, the clampers 44 can be positioned very close to the solder 7. Thus, the solder 7 can be directly heated by a heat radiation of the clampers 44. Further, because the extending part 42a of the heating head 42 is brought into contact with the top surface 5b of the shield member 5, the shield member 5 is heated by the bottom surface of the extending part 42a of the heating head 42.

The shield member 5 is heated in the state where there is less heat gradient between an upper portion (a portion on the side surface 5a) and a lower portion (a portion on the circuit board 1) of the solder 7 in the form of a fillet by being heated by the heating head device 40. The inventor measured the temperatures of the solder 7 heated by the heating head device 40, and the temperature of the upper portion of the solder 7 of a filet form was 268° C. and the temperature of the lower portion was 230° C.

Because the rework apparatus 10 according to the present embodiment is capable of efficiently heating the entire solder 7 with a small heat gradient as explained above, the solder 7 can be melted within a short period of time. It should be noted that the bottom surface of the circuit board 1 is heated by the hot-air generating device 23. Thereby, a time spent on melting the solder 7 can be reduced further.

Moreover, because the clampers 44 are tightly attached to the shield member 5 and are positioned close to the solder 7 according to the rework apparatus 10 of the present embodiment, a capacity of the heater incorporated in the heater block 41 can be set smaller than that of a conventional one in which a clamper is apart from a solder. Thus, the heater incorporated in the heater block 41 of the rework apparatus 10 can be miniaturized and power consumption of the heater can be reduced.

The clamper 44 used in the present embodiment is made of a plate-like member, and the thickness thereof is set to about 0.3 mm to about 0.5 mm. Accordingly, even if the electronic parts 2 and the electronic parts 3 are mounted on the circuit board 1 with high density, a distance equal to or greater than 0.1 mm can be provided between the clamper 44 in the attached state and each of the electronic parts 3 as illustrated in FIG. 5. Thus, the electronic parts 3 arranged close to the shield member 5 are prevented from being damaged due to interference with the clamper 44 when performing the repair process.

Further, while the heating head device 40 performs the process of melting the solder 7 by heating the shield member 5, an $N_2$ gas, which is an example of an inert gas, is injected from the $N_2$ injection holes 48 formed in the heating head 42 toward the shield member 5. Thereby, if the shield member 5 is heated, the shield member 5 is prevented from being oxidized and discolored. Additionally, it can be prevented that an insulating layer is formed on a surface of the shield member 5. Thus, even if the shield member 5 is heated, the shielding performance of the shield member 5 can be prevented from being degraded.

It should be noted that the $N_2$ gas injected from the $N_2$ injection holes 48 are injected onto the shield member 5 after passing through the heater block 41 and the heating head 42. Thus, the $N_2$ gas injected from the $N_2$ injection holes 48 is heated, and, thereby, the heating efficiency is not deteriorated due to the injection of the $N_2$ gas.

After the solder 7 is melted as mentioned above, the heating head device 40 is lifted (moved in the Z2 direction). The shield member 5 is surely retained by the heating head device 40 by the protrusions 44a being engaged with the engagement holes 6. Accordingly, the shield member 5 is removed from the circuit board 1 by the heating head device 40 being lifted up. Thereby, the electronic parts 2, which have been covered by the shield member 5, are exposed outside.

In the state where the shield member 5 is removed, a process of removing a defective electronic part 2 and a process of mounting a good electronic part 2 are performed. Those two processes together may be referred to as a part repair process. The part repair process is known in the art, and a description thereof will be omitted. While the part repair process is being performed, the heating process of the shield member 5 by the heating head device 40 is performed continuously.

After the part repair process is completed, a cream solder is applied to the circuit board 1 at a position where the shield member 5 is to be mounted. After the process of applying a cream solder is completed, a process of attaching the shield member 5 to the circuit board 5 is started. Hereinafter, the process attaching the shield member 5 again is referred to as a reattaching process.

When the reattaching process is started, the operation device 30 drives the lifting device 12 to move the heating head device 40 downward again. Thus, the bottom parts of the side surfaces 5a of the shield member 5 contact with the cream solder on the circuit board 1, and the slanting surfaces 44b of the clampers 44 are located close to the cream solder.

As mentioned above, according to the rework apparatus of the present embodiment, because the shield member 5 can be efficiently heated, a solder contained in the cream solder can be melted surely within a short period of time. By melting the solder in the cream solder, the solder can join the shield member 5 to the circuit board 1.

After the shield member 5 is again joined to the circuit board 1 by the solder 7, the operation device 30 activates the $N_2$ gas supply device 15 so as to inject an $N_2$ gas toward a joined position between the circuit board 1 and the shield member 5, that is, a position where the solder 7 is located. Thereby, the melted solder 7 is solidified within a short time, and the shield member 5 is attached (fixed) again to the circuit board 1.

After the shield member 5 is attached to the circuit board 1, the operation device 30 moves the heating head device 40 upward. The force exerted by the clampers 44 to retain the shield member 5 (including an engaging force between the protrusions 44a and the engaging holes 6) is set to be smaller than a force to join the shield member 5 to the circuit board 1. Accordingly, the protrusions 44a are disengaged from the engagement holes 6 due to the upward movement of the heating head device 40, and the clampers 44 are separated from the shield member 5. The repair process is completed by the above-mentioned series of processes.

FIG. 7A is a graph indicating a temperature rise in the shield member when a repair process is performed by a rework apparatus merely using a hot-air heating method. FIG. 7B is a graph indicating a temperature rise in the shield member 5 when a repair process is performed by the rework apparatus 10 according to the present embodiment. In each of the graphs of FIGS. 7A and 7B, the horizontal axis represents a passed time from an initiation of heating, and the vertical axis represents a temperature of the portion where the shield member 5 is soldered to the circuit board 1.

According to the rework apparatus merely using a hot-air heating method, which injects a hot air onto the shield member 5, as indicated in FIG. 7A, the temperature rise of the shield member 5 is substantially equal to the temperature rise of the electronic part (IC) mounted on the circuit board 1, and the temperature rises are slow. Thus, it is difficult to efficiently heat the shield member alone, which deteriorates the efficiency of the repair process. Additionally, because the electronic part is exposed to a high temperature for a long period of time, the electronic part may be damaged.

On the other hand, according to the rework apparatus 10 of the present embodiment, as appreciated from the graph of FIG. 7B, the rate of temperature rise of the shield member 5 is higher than that of the rework apparatus as illustrated in FIG. 7A, and the rate of the temperature rise of the electronic par 2 is lower than that of the rework apparatus as illustrated in FIG. 7A. Thus, the rework apparatus 10 according to the present embodiment is capable of increasing the efficiency of the repair process because the shield member 5 can be removed from the circuit board 1 within a short time. Additionally, because the temperature rising rate of the electronic part 2 is low, the electronic part 2 can be prevented from being damaged even if the repair process is performed.

All examples and conditional language recited herein are intended for pedagogical purposes to aid the reader in understanding the principles of the invention and the concepts contributed by the inventor to furthering the art, and are to be construed a being without limitation to such specifically recited examples and conditions, nor does the organization of such examples in the specification relates to a showing of the superiority and inferiority of the invention. Although the embodiment(s) of the present invention (s) has (have) been described in detail, it should be understood that the various changes, substitutions, and alterations could be made hereto without departing from the spirit and scope of the invention.

What is claimed is:

1. A repair apparatus comprising:
  a heating head device configured to heat a soldering member, which is soldered to a circuit board, wherein said heating head device includes:
  a heating head;
  a contact member contacting with said heating head so as to be heated by said heating head, said contact member being formed of a material having a spring characteristic and a thermal conductivity higher than a thermal conductivity of said heating head, said contact member being configured to be brought into contact with soldered side surfaces of said soldering member with an elastic force so as to melt a solder joining said soldering member to said circuit board; and
  a screw fixing the contact member to said heating head to cause an inner side surface of said contact member to directly contact to an outer side surface of said heating head,
  wherein said contact member includes at least two clamper plates configured to contact with said soldered side surfaces of said soldering member, respectively, so as to sandwich said soldering member between the two clamper plates, and
  wherein said heating head includes a surface configured and arranged to contact with a top surface of said soldering member.

2. The repair apparatus according to claim 1, wherein said heating head device further includes an attaching part to which said heating head is attached, and said heating head is movably attached to said attaching part.

3. The repair apparatus according to claim 2, wherein said heating head includes an inert gas supply part configured and arranged to supply an inert gas to said soldering member.

4. The repair apparatus according to claim 3, wherein a clearance part is formed on an end of said contact member, said clearance part being configured to prevent said contact member from contacting with said solder.

5. The repair apparatus according to claim 4, further comprising a cooling gas supply device configured to supply a cooling gas to said soldering member.

6. The repair apparatus according to claim 5, wherein said contact member is configured to retain said soldering member.

7. The repair apparatus according to claim 6, wherein said contact member is formed of an oxygen-free copper.

8. The repair apparatus according to claim 7, wherein a surface of said contact member is chrome-plated.

9. The repair apparatus according to claim 1, further comprising a heating gas supply nozzle configured to supply a heating gas to said circuit board.

10. The repair apparatus according to claim 1, further comprising a stage device configured to hold said circuit board, and a lifting device configured to move said heating head device upward and downward.

11. The repair apparatus according to claim 10, further comprising a positioning device configured to move said stage device.

* * * * *